(12) United States Patent
Xie

(10) Patent No.: US 7,273,811 B2
(45) Date of Patent: Sep. 25, 2007

(54) METHOD FOR CHEMICAL VAPOR DEPOSITION IN HIGH ASPECT RATIO SPACES

(75) Inventor: Ya-Hong Xie, Beverly Hills, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 11/169,244

(22) Filed: Jun. 27, 2005

(65) Prior Publication Data

US 2006/0290013 A1    Dec. 28, 2006

(51) Int. Cl.
*H01L 21/44* (2006.01)

(52) U.S. Cl. ............... 438/666; 438/620; 427/96.8; 427/97.2; 427/97.7; 427/124; 427/294; 257/E21.585

(58) Field of Classification Search ............... 438/482, 438/488, 684, 620, 638, 639, 666; 427/96.8, 427/97.2, 97.7, 124, 294, FOR. 106; 257/E21.585
See application file for complete search history.

(56) References Cited

U.S. PATENT DOCUMENTS

| | | | |
|---|---|---|---|
| 6,551,399 B1 | 4/2003 | Sneh et al. | |
| 7,135,421 B2 * | 11/2006 | Ahn et al. | 438/785 |
| 2005/0011457 A1 * | 1/2005 | Chiang et al. | 118/724 |
| 2005/0095872 A1 | 5/2005 | Belyansky et al. | |

* cited by examiner

Primary Examiner—George R. Fourson
Assistant Examiner—Julio J. Maldonado
(74) Attorney, Agent, or Firm—Vista IP Law Group LLP

(57) ABSTRACT

A method of depositing conformal film into high aspect ratio spaces includes the step of forming a gradient of precursor gas inside the space(s) prior to deposition. The gradient may be formed, for example, by reducing the pressure within the deposition chamber or by partial evacuation of the deposition chamber. The temperature of the substrate is then briefly increased to preferentially deposit precursor material within the closed or "deep" portion of the high aspect ratio space. The process may be repeated for a number of cycles to completely fill the space(s). The process permits the filling of high aspect ratio spaces without any voids or keyholes that may adversely impact the performance of the resulting device.

19 Claims, 3 Drawing Sheets

METHOD FOR CHEMICAL VAPOR DEPOSITION IN HIGH ASPECT RATIO SPACES

FIELD OF THE INVENTION

The field of the invention generally relates to methods of depositing conformal films on substrates. In particular, the field of the invention relates to methods of depositing conformal films on or into high aspect ratio spaces such as, for example, gaps, vias and trenches.

BACKGROUND OF THE INVENTION

The semiconductor industry is increasingly being driven to decrease the size of semiconductor devices located on integrated circuits. For example, miniaturization is needed to accommodate the increasing density of circuits necessary for today's semiconductor products. The rapid advancement of silicon-based integrated circuit technology brings along the increasingly stringent requirement on the ability of depositing film into spaces having high aspect ratios, e.g. spaces where the ratio of the longest dimension to the shortest dimension is greater than 10. Many semiconductor devices include, for example, vias, gaps, trenches or other structures that contain large aspect ratios that present unique deposition process challenges.

One such problem arises when a space having a large aspect ratio is filled using chemical vapor deposition (CVD) techniques. One example includes trenches having high aspect ratios that are filled using CVD processes. In conventional processes, the trench may be formed with one or more voids or keyholes contained therein. The voids or keyholes are created because the deposition reactants tend to preferentially grow cusps or huts near the vicinity of the entrance (e.g., top portion) of the trench. This results in a greater thickness of the deposited layer near the mouth or opening of the trench compared to the end or bottom. Consequently, the deposited layer nearer the opening of the trench closes or pinches, creating voids or spaces that are left unfilled.

The voids left in semiconductor devices pose a significant problem. For example, voids may result in failure of the device caused by gases (or other materials) contained in the voids. In addition, it is possible that voids may be filled with conductive material during subsequent deposition processes thereby causing shorts in the device components.

U.S. Patent Application No. 2005/0095872 ("Belyansky et al.") discloses a process for filing high aspect ratio gap filing. According to Belyansky et al., a substrate having gaps to be filled is contacted with a first oxide precursor under high density plasma conditions at a first pressure less than about 10 millitorr, wherein gaps are partially filled with a first oxide material. The substrate is then contacted with a second oxide precursor material and an inert gas under high density plasma conditions at a second pressure greater than 10 millitorr, wherein the gaps are further filled with the second oxide material.

In another aspect, Belyansky et al. discloses a method of depositing a conformal dielectric layer on a substrate disposed in a process chamber wherein a substrate having a gap to be filled is provided on an electrode in the process chamber. An oxide precursor is flowed into the chamber at a pressure less than 10 millitorr to partially fill the gap. The pressure within the chamber is increased to greater than 10 millitorr and an inert gas is flowed into the chamber to fill the gap.

Belyanski et al. thus utilizes a one or two component oxide precursor material utilizing a high density plasma chemical vapor deposition (HDP-CVD) system.

There thus is a need for a CVD-based process for depositing conformal films in high aspect ratio spaces without the use of high density plasma systems. For example, there is a need for a process that utilizes variable pressure (VPCVD) methods that can result in void or keyhole-free fills or films in spaces having aspect ratios higher than 10. For example, there is a need for a method for conformal deposition in spaces having nanometer-sized dimensions with aspect ratios as high as or greater than 10,000.

SUMMARY OF THE INVENTION

In one aspect of the invention, a CVD-based process for filling high aspect ratio spaces in a substrate includes the step of forming a gradient of precursor gas inside the space(s) prior to deposition. The gradient may be formed, for example, by first filling a deposition chamber with the reactant gas at high pressure, followed by reducing the pressure within the deposition chamber or by partial evacuation of the deposition chamber. The temperature of the substrate is then briefly increased to preferentially deposit precursor material within the "deep" portion of the high aspect ratio space. The process may be repeated for a number of cycles to completely fill the space(s). The process permits the filling of high aspect ratio spaces without any voids or keyholes that may adversely impact the performance of the resulting device.

In one aspect of the invention, a method of depositing conformal film into high aspect ratio spaces including providing a substrate having a space with an aspect ratio greater than 10 in a deposition chamber. The substrate is maintained at a temperature below a threshold value at which deposition takes place. A precursor gas is introduced into the deposition chamber. The deposition chamber is then partially evacuated. A gradient of precursor gas is created in the spaces with the end or deeper part of the space having a higher concentration than the opening to the space. The temperature of the substrate is then briefly increased above the threshold temperature value. The actual time delay between the time when the high aspect ratio spaces are filled with the precursor gas and the time when the substrate is heated to CVD deposition temperature can be optimized for maximum utilization of the reactant gas, and for controlling the profile at the entrance point of the high aspect ratio structure. The precursor gas contained in the space is then deposited onto the substrate surface. The process may be repeated over multiple cycles to completely fill the space.

In one aspect of the invention, the space or spaces filled in accordance with process have an aspect ratio much larger than 10 (e.g., greater than $10^3$ or $10^4$).

In another aspect of the invention, a method of depositing conformal film into high aspect ratio spaces includes the steps of providing a substrate having a space with an aspect ratio greater than 10 inside a deposition chamber. The substrate is maintained at a temperature below the threshold temperature for a chemical vapor deposition reaction to take place. A precursor gas is then introduced into the deposition chamber. The deposition chamber is then partially evacuated as soon as equilibrium pressure is established or nearly established inside the high aspect ratio structures (e.g., vias). The temperature of the substrate is then increased to above the threshold temperature for chemical vapor deposition. The temperature of the substrate is lowered to below the CVD threshold deposition temperature immediately after substantially all of the reactant gas has reacted with the interior surfaces of the high aspect ratio structure (e.g., walls of the via) with a thin layer of film being deposited. The evacuation process is continued until most of the gaseous by-produce is evacuated from the lowermost or "deepest" regions of the high aspect ratio structures. The process is repeated a number of times to progressively fill in the space from the bottom to the top.

In another aspect of the invention, the time delay between the time when the high aspect ratio structures are filled with the precursor gas and the time when the substrate is heated to CVD deposition temperature can be optimized for maximum utilization of the reactant gas, and for controlling the profile at the entrance point of the high aspect ratio structures.

It is an object of the invention to provide a reaction-limited process for filling large aspect ratio spaces on a semiconductor substrate. Is a further object of the invention to provide a process of filling large aspect ratio spaces with no voids or keyholes by creating a pressure gradient of the precursor gas within the high aspect ratio spaces, wherein the pressure is lower near the opening or entrance to the spaces.

DETAILED DESCRIPTION OF THE PREFERRED EMBODIMENTS

Figure 1:
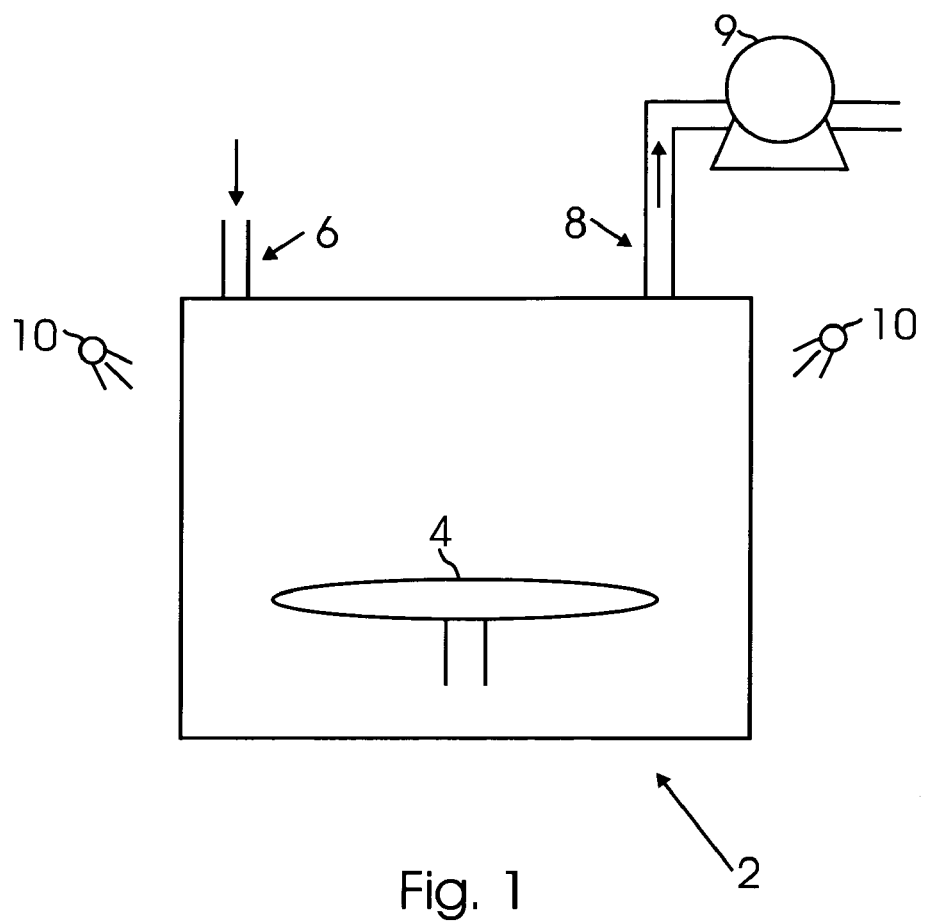
FIG. 1 illustrates a deposition chamber used for chemical vapor deposition of conformal films into high aspect ratio spaces.

FIG. 1 illustrates a deposition chamber 2 used for chemical vapor deposition of conformal films. The deposition chamber 2 may be a chamber used, for example, in low pressure chemical vapor deposition (LPCVD) and/or rapid temperature chemical vapor deposition (RTCVD). The deposition chamber 2 is preferably able to rapidly change pressure in response to a user input or control algorithm. The deposition chamber 2 illustrated in FIG. 1 includes a substrate 4 therein. Of course, multiple substrates 4 may be located inside the deposition chamber 2. The substrate 4 may comprise substrate material commonly used in integrated circuit technology and/or MEMS devices. The substrate 4 may comprise silicon or other semiconductor material. The substrate 4 may include active regions that need to be separated or otherwise isolated from one another, e.g., transistors separated by trenches or other isolation structures.

The deposition chamber 2 preferably includes one or more inlets 6 and outlets 8 for the introduction and evacuation of gases for the deposition process. In addition, the outlet 8 to the deposition chamber 2 is connected to an evacuation pump 9 which is used to adjust the pressure within the deposition chamber 2. The gases may include, for example, precursor gases as well as inert gases used during the deposition process. Preferably, pressure within the deposition chamber 2 is controllable by an operator using, for instance, an external controller (not shown). Such control systems are well known to those skilled in the deposition arts and are found, for example, on existing deposition systems.

The deposition chamber 2 preferably includes one or more optically transparent windows or the like that allow the transmission of radiation into the deposition chamber 2. As seen in FIG. 1, the deposition chamber 2 is accompanied by one or more substrate heaters 10. FIG. 1 illustrates two Rapid Thermal Processing (RTP) heaters 10 that emit radiation to heat the substrate 4. RTP provides fast heating and cooling to process temperatures of approximately 200-1300° C. with ramp rates typically 20-250° C. per second, within a 1-2 minute timeframe. RTP systems use a variety of heating configurations, energy sources and temperature control methods. Typically, the most common approach involves heating the substrate 4 using banks of tungsten halogen lamps. The heaters 10 may be located external (as shown in FIG. 1) to or even inside the deposition chamber 2.

Figure 2:
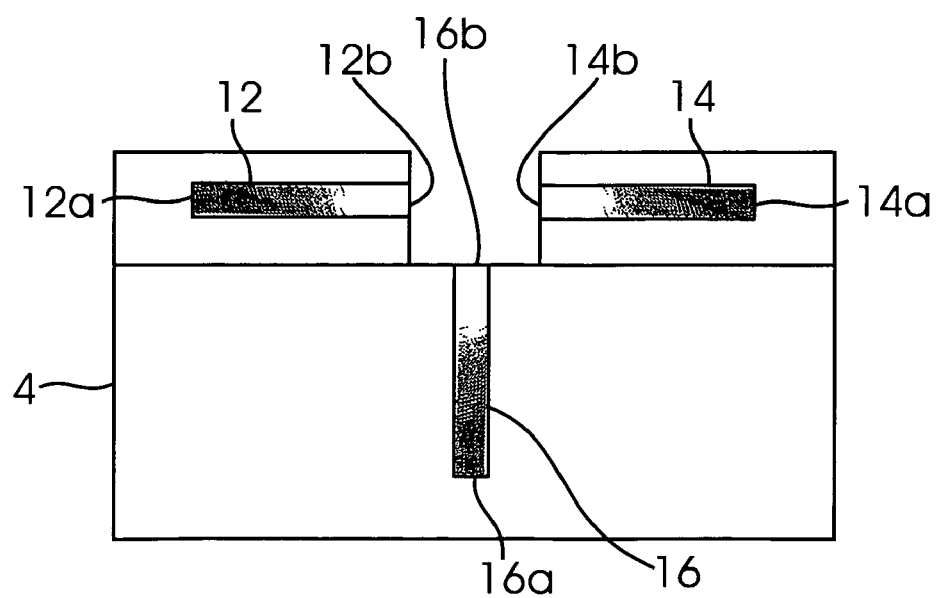
FIG. 2 illustrates a side view of a substrate having a plurality of high aspect ratio spaces.

FIG. 2 illustrates a side view of a substrate 2 having three high aspect ratio spaces 12, 14, and 16. Each space (12, 14, and 16) has an aspect ratio greater than 10. The aspect ratio is length of the space's longest dimension divided by the space's shortest dimension. In one aspect of the invention, the aspect ratio of spaces (12, 14, 16) is significantly higher than 10, for example, greater than $10^3$ or even greater than $10^4$. FIG. 2 illustrates three such spaces 12, 14, 16 having contained therein a precursor 18. The precursor 18 is in gaseous form and is contained within the void of spaces 12, 14, and 16.

FIG. 2 illustrates a gradient of the precursor 18 established within each space 12, 14, and 16. In accordance with a preferred aspect of the method, a gradient of the precursor 18 is established within the spaces 12, 14, 16 of the substrate 4 such that a higher concentration of the precursor 18 is found at the end portions 12a, 14a, 16a of the spaces 12, 14, 16 and a lower concentration is found at the opening portions 12b, 14b, 16b of the spaces 12, 14, 16. In this regard, the spaces 12, 14, 16 may be filled from the ends toward the openings (e.g., bottom up) without the formation of any voids or keyholes. While FIG. 2 illustrates three such spaces 12, 14, 16, the method described herein is not limited by the number or quantity of such spaces. Moreover, the method described herein may be used with spaces having different orientations or geometries within the substrate 4 (such as spaces 12, 14, and 16).

Figure 3:
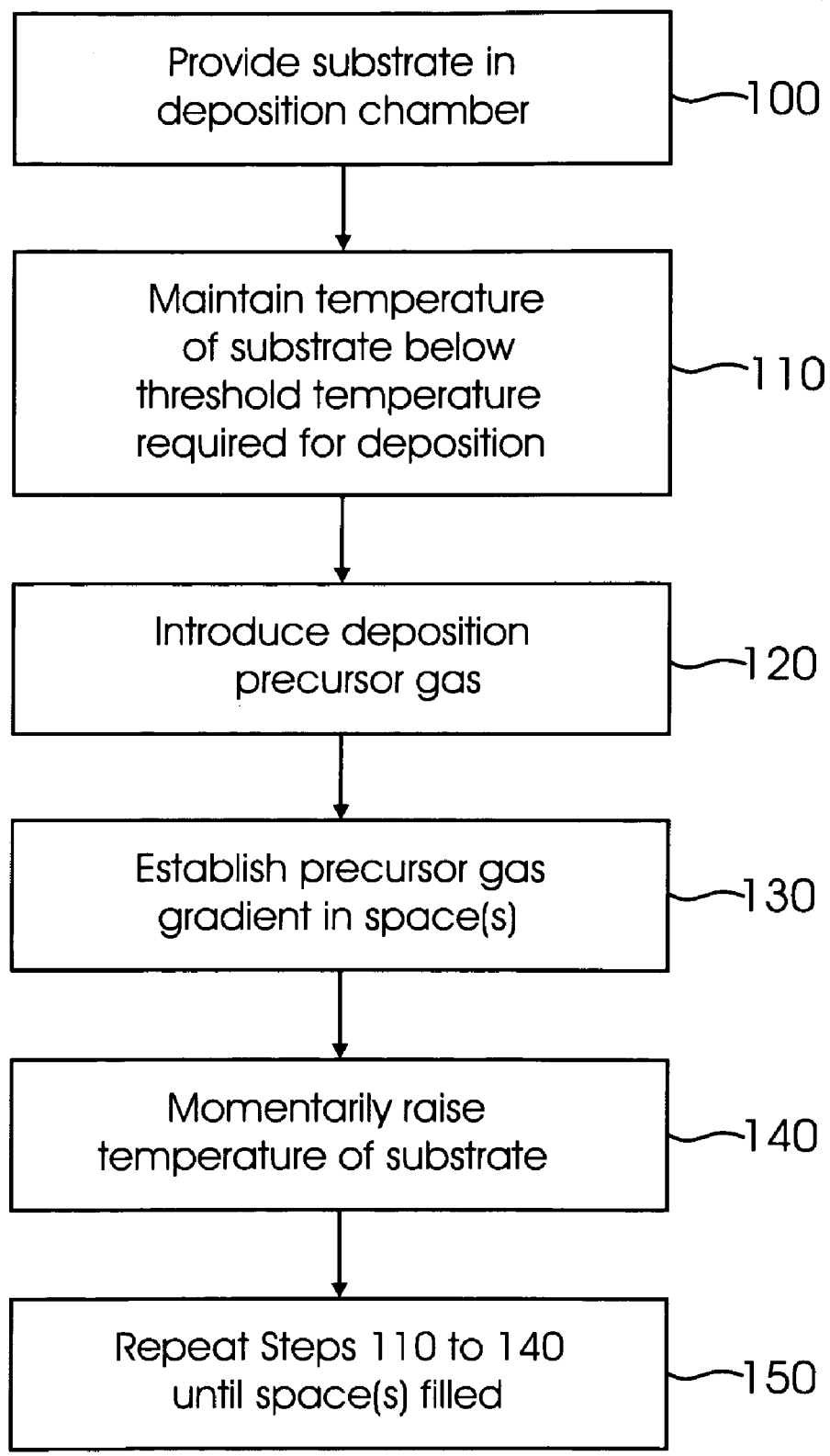
FIG. 3 illustrates a process flow chart for a process of depositing a conformal thin film into a high aspect ratio space according to one embodiment of the invention.

With reference now to FIG. 3, a process or method is shown for deposing a thin, conformal film into high aspect ratio spaces 12, 14, 16. Initially, as shown in step 100, a substrate 4 is provided in the deposition chamber 2, for example, a LPCVD deposition chamber 2. The substrate 4 has one or more spaces having an aspect ratio greater than 10. In step 110, the temperature of the substrate 4 is maintained at a temperature below a threshold temperature or temperature range required for chemical vapor deposition to take place. Next, in step 120, a deposition precursor gas 18 is introduced into the deposition chamber 2. In one aspect of the process, it is desirable that the pressure at this stage be as high as allowed by the deposition chamber 2 construction so that a maximum thickness of film can be deposited with each cycle. The deposition precursor gas 18 may include, for example, metallic species, semiconducting species, or insulating species.

In one aspect of the invention, as shown in step 130, after the precursor gas 18 has infiltrated spaces 12, 14, 16, the deposition chamber 2 is partially evacuated. The partial evacuation of the deposition chamber 2 creates a gradient of precursor gas 18 within the spaces 12, 14, 16 as described above. In step 140, the temperature of the substrate 4 is briefly increased above the threshold temperature or temperature range required for deposition of the precursor gas 18 onto the substrate 4, in particular, for deposition to take place deep inside the high aspect ratio spaces. Because the thickness of the film deposited during each cycle is proportional to the local pressure of the precursor gas, and further because the heating takes place when the chamber is beginning to be evacuated, the deposited film thickness is always higher at the deeper end of individual high aspect ratio structures (e.g. vias). Therefore, by creating a pressure gradient, the mechanism of keyhole formation is effectively reversed allowing for deep vias to be filled from the bottom to the top, and no danger of the entrance being "pinched off". In a preferred embodiment, the temperature of the substrate 4 is raised by use of one or more RTP heaters 10.

In the process described above, a single conformal thin film is deposited in the spaces 12, 14, and 16. Preferably, the process (e.g., steps 110 through 140) is repeated a plurality of times to completely fill the spaces 12, 14, 16. For example, each cycle of the process may deposit a film having a thickness within the range of about 0.1 nm to about 3 nm. The process may be repeated until the spaces 12, 14, 16 are completely filled. For example, the complete filling of a space (12, 14, 16) may include a thickness with a range from about 0.1 nm to about 1 μm.

In one aspect of the process, the deposition is allowed to proceed (by briefly increasing the temperature of the substrate 4) long enough to consume nearly all the precursor gas 18 within the spaces 12, 14, 16. For example, the deposition reaction inside the spaces 12, 14, 16 is stopped when a majority of the precursor gas 18 (but not all) is deposited into the internal spaces 12, 14, 16. In this regard, the deposition reaction during each cycle begins in a reaction-limited regime and ends up in a gas supply-limited regime. The temperature of the substrate 2 may be briefly increased for a period of time that lasts less than a second, seconds or even a few minutes depending on the reaction rate inside the internal spaces 12, 14, 16.

Figure 4A:
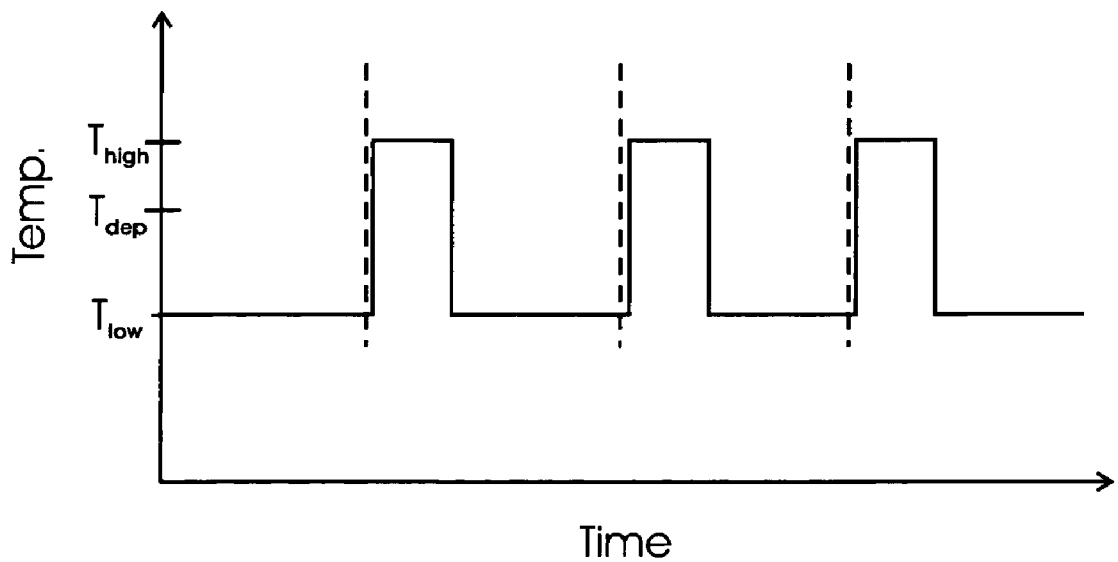
FIG. 4A illustrates a graph illustrating the temperature of the substrate as a function of time for several deposition cycles.
Figure 4B:
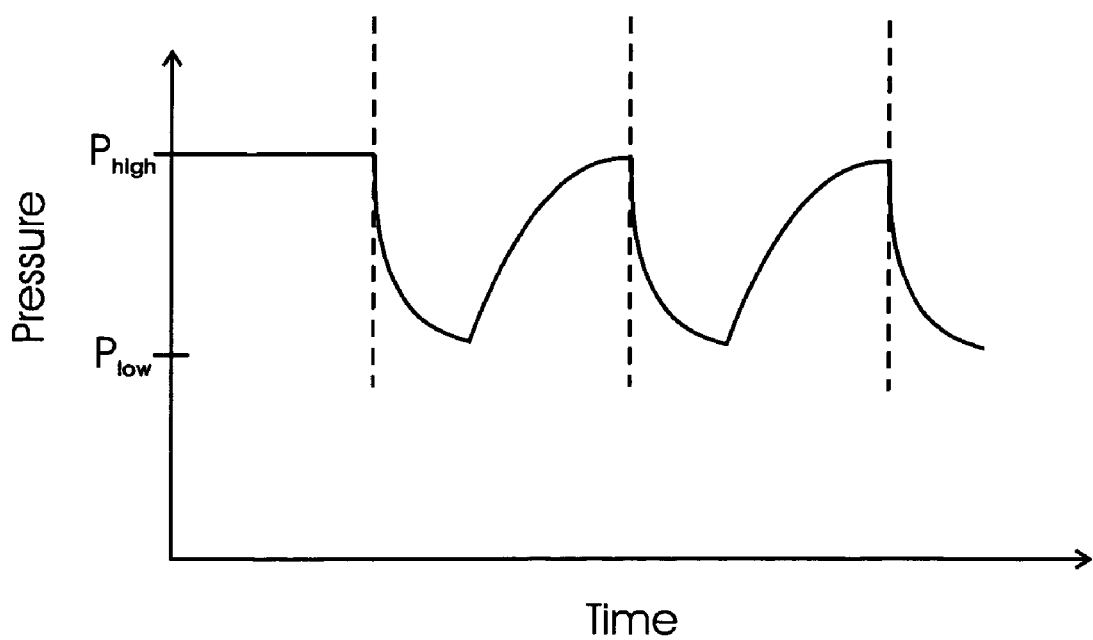
FIG. 4B illustrates a graph illustrating the pressure of the deposition chamber as a function of time for several deposition cycles.

FIGS. 4A and 4B illustrate the temperature and pressure profiles of a plurality of cycles of a deposition process in accordance with one embodiment of the deposition process. As seen in FIG. 4A, the temperature of the substrate 4 is cycled between low and high temperatures by, for example, RTP heaters 10. As seen in FIG. 4A, the low temperature $T_{low}$ is below the threshold deposition temperature $T_{dep}$ while the high temperature $T_{high}$ is above the deposition temperature. FIG. 4B illustrates the pressure profile through the same deposition cycles illustrated in FIG. 4A. As seen in FIG. 4B, the pressure alternates between low and high pressures $P_{low}$, $P_{high}$. In one aspect of the invention, the profile of the pressure change versus time and the profile of the temperature change versus time are out-of-phase. For example, as shown in FIGS. 4A and 4B, the temperature is briefly increased after the pressure is initially reduced within the deposition chamber 2 (after the gradient has been established in the high aspect ratio spaces 12, 14, 16). The temperature is then decreased to a lower value after nearly all the precursor gas 18 within the spaces 12, 14, 16 has been deposited.

In one aspect of the invention, the reaction of the precursor gas 18 within the spaces 12, 14, 16 is stopped by reducing the temperature of the substrate 4 below a threshold value after the pressure drops below a certain level of threshold level. In another aspect of the invention, the reaction of the precursor gas 18 within the spaces 12, 14, 16 is stopped by reducing the temperature of the substrate after a pre-determined amount of time.

While embodiments of the present invention have been shown and described, various modifications may be made without departing from the scope of the present invention. The invention, therefore, should not be limited, except to the following claims, and their equivalents.

What is claimed is:

1. A method of depositing conformal film into high aspect ratio spaces comprising:
   a) maintaining a substrate having at least one space with an aspect ratio greater than 10 at a temperature below a deposition temperature at which deposition takes place;
   b) exposing the substrate to a precursor gas at an initial pressure;
   c) partially reducing the pressure surrounding the substrate so as to create a gradient of the precursor gas within the at least one space; and
   d) increasing the temperature of the substrate above the deposition temperature while the substrate is under the reduced pressure.

2. The method of claim 1, wherein steps (a) through (d) are repeated a plurality of times.

3. The method of claim 1, wherein the film comprises a metallic film.

4. The method of claim 1, wherein the film comprises a semiconducting film.

5. The method of claim 1, wherein the film comprises an insulating film.

6. The method of claim 1, wherein the total thickness of the film ranges from about 0.1 nm to about 1 μm.

7. The method of claim 1, wherein the spaces have has an aspect ratio greater than 100.

8. The method of claim 1, wherein the spaces have an aspect ratio greater than 1000.

9. A method of depositing conformal film into high aspect ratio spaces comprising:
   a) maintaining a substrate having a space with an aspect ratio greater than 10 at a temperature below the deposition temperature at which chemical vapor deposition takes place;
   b) exposing the substrate to a precursor gas at an initial charge pressure;
   c) partially reducing the pressure surrounding the substrate so as to leave a portion of the precursor gas within the space;
   d) increasing the temperature of the substrate above the deposition temperature while the substrate is subject to the reduced pressure;
   e) lowering the temperature of the substrate below the deposition temperature for chemical vapor deposition; and
   f) repeating steps (a) through (e) a plurality of times.

10. The method of claim 9, wherein the film comprises a metallic film.

11. The method of claim 9, wherein the film comprises a semiconducting film.

12. The method of claim 9, wherein the film comprises an insulating film.

13. The method of claim 9, wherein the total thickness of the film ranges from about 0.1 nm to about 1 μm.

14. The method of claim 9, wherein the temperature is reduced below the deposition temperature after the reduced pressure falls below a threshold value.

15. The method of claim 9, wherein the temperature is reduced below the deposition temperature after a pre-determined amount of time.

16. The method of claim 9, wherein the thickness of the film deposited during each cycle ranges from about 0.1 nm to about 3 nm.

17. A semiconductor device produced by the process of claim 1.

18. A semiconductor device produced by the process of claim 9.

19. A method of depositing conformal film into a high aspect ratio space comprising:

a) maintaining a substrate having a space with an aspect ratio greater than 10 at a temperature below a deposition temperature;

c) exposing the substrate to a precursor gas at an initial pressure;

d) establishing a gradient of the precursor gas within the space by partially reducing the pressure of the precursor gas, wherein a deepest portion of the space has the highest concentration of precursor gas; and e) increasing the temperature of the substrate above the deposition temperature while at the reduced pressure of precursor gas.

* * * * *

UNITED STATES PATENT AND TRADEMARK OFFICE
CERTIFICATE OF CORRECTION

PATENT NO. : 7,273,811 B2 Page 1 of 1
APPLICATION NO. : 11/169244
DATED : September 25, 2007
INVENTOR(S) : Ya-Hong Xie It is certified that error appears in the above-identified patent and that said Letters Patent is hereby corrected as shown below:

Col. 4, line 15, replace "°C. with ramp rates typically 20-250°C." with -- °C with ramp rates typically 20-250°C --

Col. 6, Claim 7, Line 37, remove "has"

Signed and Sealed this

First Day of July, 2008

JON W. DUDAS
*Director of the United States Patent and Trademark Office*